United States Patent
Abedifard et al.

(10) Patent No.: US 7,180,781 B2
(45) Date of Patent: Feb. 20, 2007

(54) MEMORY BLOCK ERASING IN A FLASH MEMORY DEVICE

(75) Inventors: Ebrahim Abedifard, Sunnyvale, CA (US); Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 11/210,083

(22) Filed: Aug. 23, 2005

(65) Prior Publication Data

US 2005/0276119 A1 Dec. 15, 2005

Related U.S. Application Data

(63) Continuation of application No. 10/681,482, filed on Oct. 8, 2003, now Pat. No. 6,975,538.

(51) Int. Cl.
*G11C 16/04* (2006.01)

(52) U.S. Cl. ............... 365/185.19; 365/185.22; 365/185.3

(58) Field of Classification Search ........... 365/185.19, 365/185.22, 185.29, 185.33
See application file for complete search history.

(56) References Cited

U.S. PATENT DOCUMENTS

| | | | |
|---|---|---|---|
| 5,636,162 A | 6/1997 | Coffman | |
| 6,172,917 B1 * | 1/2001 | Kataoka et al. | 365/189.05 |
| 6,314,027 B1 | 11/2001 | Choi | |
| 6,504,765 B1 | 1/2003 | Joo | |
| 6,545,911 B2 | 4/2003 | Chou | |
| 6,563,741 B2 | 5/2003 | Mihnea | |
| 6,654,292 B2 | 11/2003 | Keays | |
| 6,714,459 B2 | 3/2004 | Hirano | |
| 6,903,974 B2 | 6/2005 | Wooldridge | |
| 6,975,538 B2 * | 12/2005 | Abedifard et al. | 365/185.19 |
| 2003/0053348 A1 | 3/2003 | Marotta | |
| 2003/0072181 A1 | 4/2003 | Keays | |
| 2003/0214852 A1 | 11/2003 | Chang | |
| 2004/0013002 A1 | 1/2004 | Mun Jung | |
| 2004/0017722 A1 | 1/2004 | Cavaleri | |
| 2004/0027886 A1 | 2/2004 | Tomita | |

* cited by examiner

*Primary Examiner*—Gene N. Auduong
(74) *Attorney, Agent, or Firm*—Leffert Jay & Polglaze, P.A.

(57) ABSTRACT

An erase pulse is applied to the memory block to be erased. An erase verification operation is performed to verify that each memory cell of the memory block is erased. If a memory cell has a current less than a first sense amplifier current reference level, additional erase pulses are applied to that cell until either the erase current is in the range of 30–40 µA or a maximum quantity of erase pulses have been applied. A leakage check is performed to determine if any cells have been overerased. If a cell has an erase current greater than or equal to a second sense amplifier current reference level, soft programming pulses are applied to the cell until either its erase current is less than the second reference level or a maximum quantity of soft program pulses have been applied.

20 Claims, 3 Drawing Sheets

MEMORY BLOCK ERASING IN A FLASH MEMORY DEVICE

RELATED APPLICATION

This Application is a Continuation of U.S. application Ser. No. 10/681,482, titled "MEMORY BLOCK ERASING IN A FLASH MEMORY DEVICE," filed Oct. 8, 2003, now U.S. Pat. No. 6,975,538 which is commonly assigned and incorporated herein by reference.

TECHNICAL FIELD OF THE INVENTION

The present invention relates generally to memory devices and in particular the present invention relates to erasing flash memory devices memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

As is well known in the art, a prior art erase operation in flash memory is typically comprised of three separate activities. The entire array is pre-programmed, the memory block is erased, and a soft programming or $V_t$ tightening operation is performed.

The memory array to be erased is pre-programmed in order to reduce the chances of the cells going into a depletion mode. As the cells in a flash memory device get erased, they may get erased to the point where they go into depletion and conduct current even when those cells have a gate voltage of 0 V. This affects the reading of all other cells in their respective columns. By pre-programming the memory, the cells start from a known, programmed state and are therefore less likely to go into an overerased depletion state.

The erase operation is then conducted to ensure that all cells are erased to at least a minimum level. At the end of the erase operation, there is no guarantee that some cells have not been over-erased. In this case, a $V_t$ tightening operation is performed. This operation is also referred to in the art as a soft programming operation.

The soft programming operation is a short programming pulse that is intended to pull memory cells that are depleted back into the normal population of erased cells. $V_t$ is the gate voltage to which the memory cell is programmed. This operation may be accomplished by pulsing the cell, then checking for the erased state. This operation is repeated until all depleted cells are left with proper threshold voltages or a maximum quantity of soft programming pulses is exceeded. In the latter case, an erase error has occurred.

Performing all of these steps to erase a block of memory makes the erase operation of a flash memory device a time consuming operation. For the reasons stated above, and for other reasons stated below which will become apparent to those skilled in the art upon reading and understanding the present specification, there is a need in the art for a faster, more efficient erase algorithm in a flash memory device.

SUMMARY

The above-mentioned problems with reducing the time of erasing a memory device and other problems are addressed by the present invention and will be understood by reading and studying the following specification.

The present invention encompasses a method for erasing a block of memory in a flash memory device. The block of memory has a plurality of memory cells that are organized in columns and rows.

The method comprises transmitting an erase pulse to the block of memory in order to erase the cells. A current leakage check is performed on each column to determine if any cells are overerased. If a column is detected that has current leakage, a search is performed for the overerased memory cell in that column that has an erase current greater than a reference current level. In one embodiment this reference current level is the sense amplifier reference current level. A soft program pulse is applied to the overerased memory cell until the erase current is less than the reference current level.

Further embodiments of the invention include methods and apparatus of varying scope.

DETAILED DESCRIPTION

Figure 1:
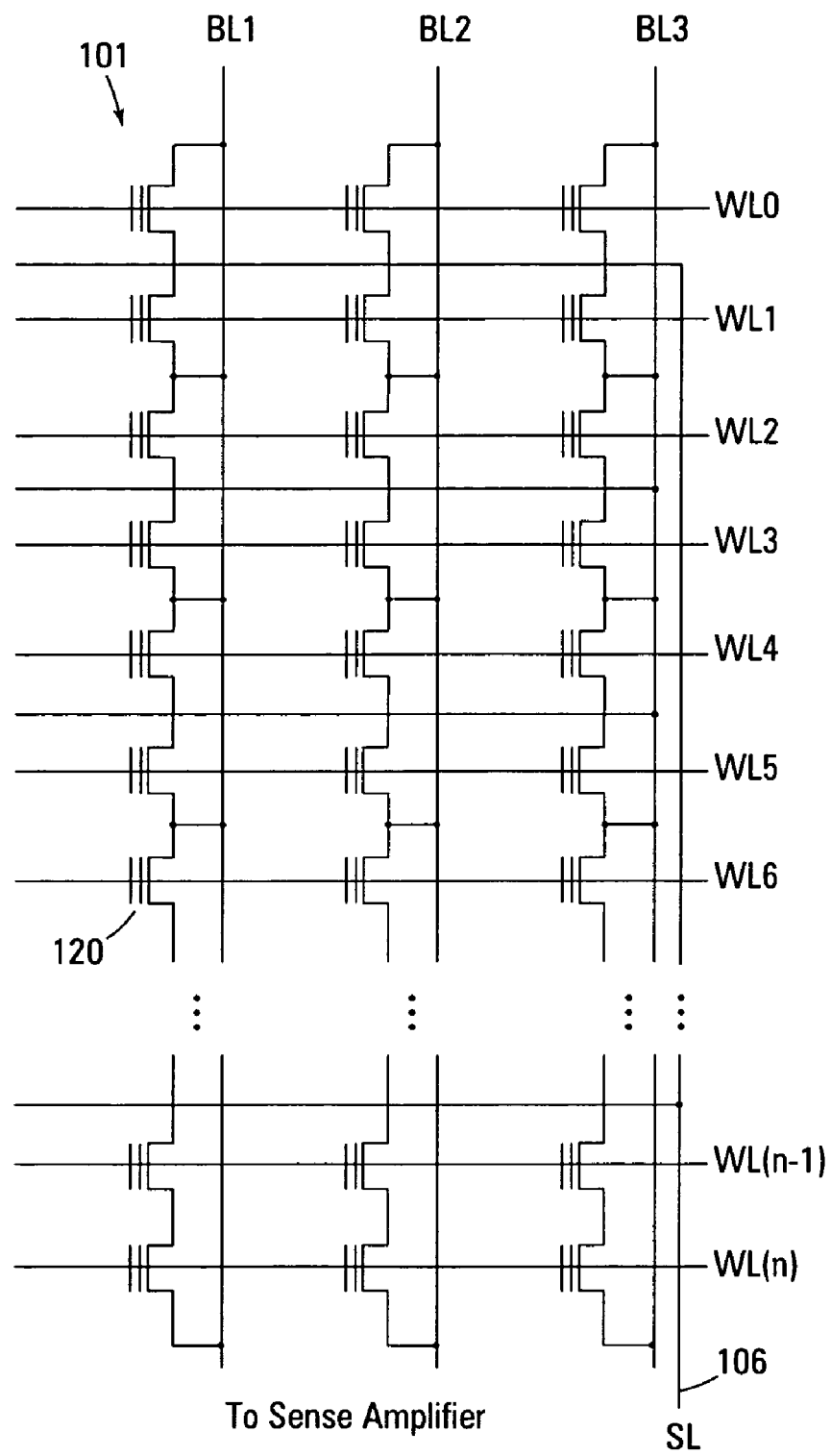
FIG. 1 shows a simplified diagram of a typical flash memory array of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a typical NOR-type flash memory array in accordance with the method of FIG. 1. The memory is comprised of an array 101 of floating gate cells 120 arranged in rows and columns in a NOR-like structure. Flash cells sharing the same gate constitute wordlines (WL0–WLn). Flash cells sharing the same drain electrode constitute a bitline (BL1–3). The source electrode 106 is common to all of the cells.

The NOR flash memory of FIG. 1 is for purposes of illustration only and cannot show an entire memory array of a memory device. The present invention is not limited to NOR-type flash memory. Alternate embodiments include NAND or other types of flash memory.

Figure 2:
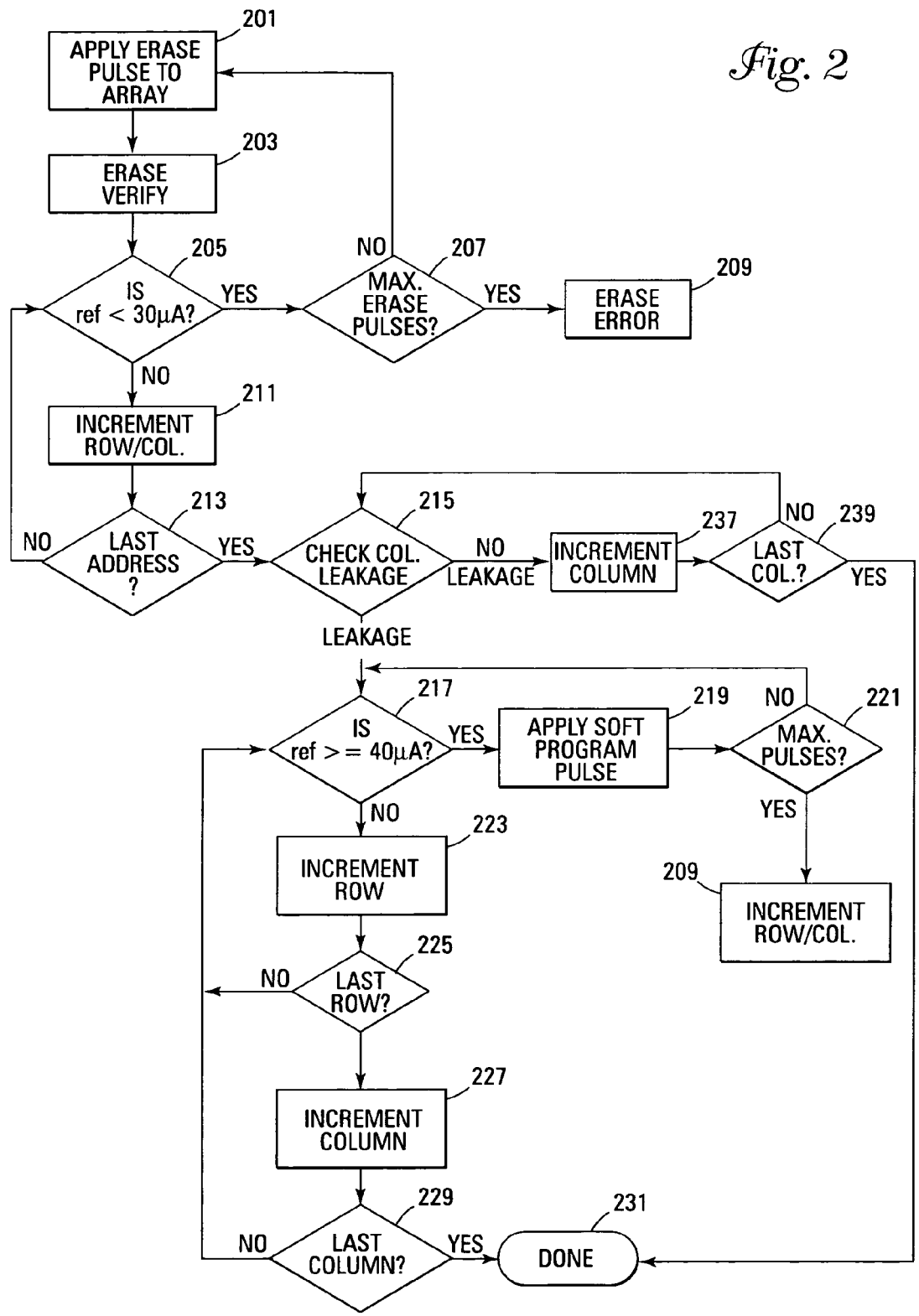
FIG. 2 shows a flowchart of one embodiment of a method of the present invention for memory block erasing.

One embodiment of the erase method of the present invention greatly reduces the time required to perform an erase operation on a memory array by eliminating the pre-program step. This embodiment performs only an erase and soft program sequence in order to erase a memory array. FIG. 2 illustrates a flowchart of one embodiment of the method of the present invention for memory block erasing.

The memory array receives an erase pulse 201 to initiate the erase operation. An erase verify operation 203 is then performed in order to determine the success of the erase operation on each cell of the memory array.

The erase verify operation comprises, at least in part, comparing each cell's erase current to a sense amplifier reference current level ($IS_{ref}$) of 30 µA 205. Alternate embodiments may use other current thresholds for comparison.

When a cell's erase current is checked, a voltage of approximately 4.5V is applied to the wordline of the selected row. A voltage of approximately −1.5V is applied to the wordlines of the rows that are not selected. This is in contrast to the prior art method of applying a voltage of 0V to the unselected wordlines. The negative voltage reduces the possibility of reading a background current from other over-erased cells on the desired bitline. Alternate embodiments may use other voltages for the selected and unselected wordlines to achieve substantially similar results.

If the selected cell has a current that is less than 30 µA 205, it has not been sufficiently erased. In this case, the number of erase pulses that have already been applied to the cell is checked 207. In one embodiment, the maximum quantity of erase pulses allowed is one thousand pulses. However, alternate embodiments use other erase pulse quantities.

If the maximum quantity of erase pulses has already been applied to the cell 207, an erase error has occurred 209. The erase operation then stops so that another process can substitute a redundant row for the row containing the defective cell or the memory device is considered defective.

If the maximum quantity of erase pulses have not been used 207, another erase pulse is applied 201 and the cell's erase current is rechecked. This continues until the erase current for the cell is greater than or equal to the threshold reference current or an erase error occurs. In an alternate embodiment, the erase pulses are applied until the erase current is just greater than the threshold reference current. In one embodiment, the threshold reference current is 30 µA. Alternate embodiments may use other thresholds.

The row and column numbers are then incremented 211 so that the erase current for each cell in each row and column is checked. The address is checked 213 to determine if the last address has been reached. The addresses are checked and the row and column numbers incremented until the last address has been checked.

The operation then checks the leakage current for each column 215, starting at column 0. Leakage current in a flash memory cell occurs, at abnormally low voltages, when there is tunneling from the floating gate through the insulating oxide surrounding the floating gate. This can result from holes that become trapped in the tunnel oxide of the flash memory cells after the memory cell has been cycled through read, write and erase operations a number of times. Leakage can severely degrade the performance of the memory.

If no leakage is detected, the column number is incremented 237 and checked for the last column 239. If the leakage current for each column has been checked and none has been found, the erase operation has been successfully completed 231.

If leakage current is detected in a column, another erase verify operation is performed from row 0 on the failed column using a sense amplifier current reference level ($IS_{ref}$) of 40 µA 217. Alternate embodiments use other reference level currents. As in the previous erase verify operation, the selected wordlines have 4.5V applied while the unselected wordlines have −1.5V applied.

If the cell erase current is less than the sense amplifier current reference level, the row is incremented 223 in order to step through the rows and determine which row in the column caused the leakage. The row number is checked to determine if the last row has been checked 225. If the last row has been checked 225, the column is then incremented 227 to move the operation to the next column and its rows. The column number is checked to determine if cell current levels of the last column and all of its rows have been checked 229. If the last column has been checked 229, the erase operation is complete 231. If the last row and/or the last column have not been checked 225 and 227, the operation returns to the step of comparing the cell erase current to the sense amplifier current reference level 217 after the row or column numbers have been incremented 223 or 227.

If the cell erase current is determined to be greater than or equal to the sense amplifier current reference level (e.g., 40 µA), the cell has been overerased. A soft program pulse is applied 219 to the depleted memory cell in order to pull its $V_t$ back into the normal population of erased cells.

The soft programming pulse is different from a normal programming pulse in that the wordline and bitline voltages are lower for the soft programming pulse. In one embodiment, a normal programming pulse uses a wordline voltage of 3.0–4.0V and a bitline voltage of 3.0–4.0V. A soft programming pulse uses a wordline voltage of approximately 2.5V and a bitline voltage of approximately 3.0V. Alternate embodiments use other voltages for both normal programming and soft programming pulses.

After the soft programming pulse 219, the pulse count is checked 221 to determine if it has reached the maximum quantity of programming pulses allowed to be applied. In one embodiment, this maximum pulse threshold is one thousand pulses. Alternate embodiments use other thresholds.

If the maximum pulse threshold has been reached, an erase error has occurred 209. The erase operation then ends and the memory device is either unusable or another process substitutes a redundant column for the bad column.

If the maximum pulse threshold has not been reached, the operation returns to again compare the cell erase current with the sense amplifier current reference level 217. This loop continues 217, 219, and 221 until either the cell erase current is less than the sense amplifier current reference level or an erase error has occurred. In an alternate embodiment, the loop continues until the cell erase current is substantially equal to the sense amplifier current reference level.

An additional benefit of the method of FIG. 2 is that the erase cell current distribution is improved. By checking and adjusting each cell's erase current to a predetermined threshold, the current distribution of the memory array is more closely maintained in a range of 30–40 µA.

Figure 3:
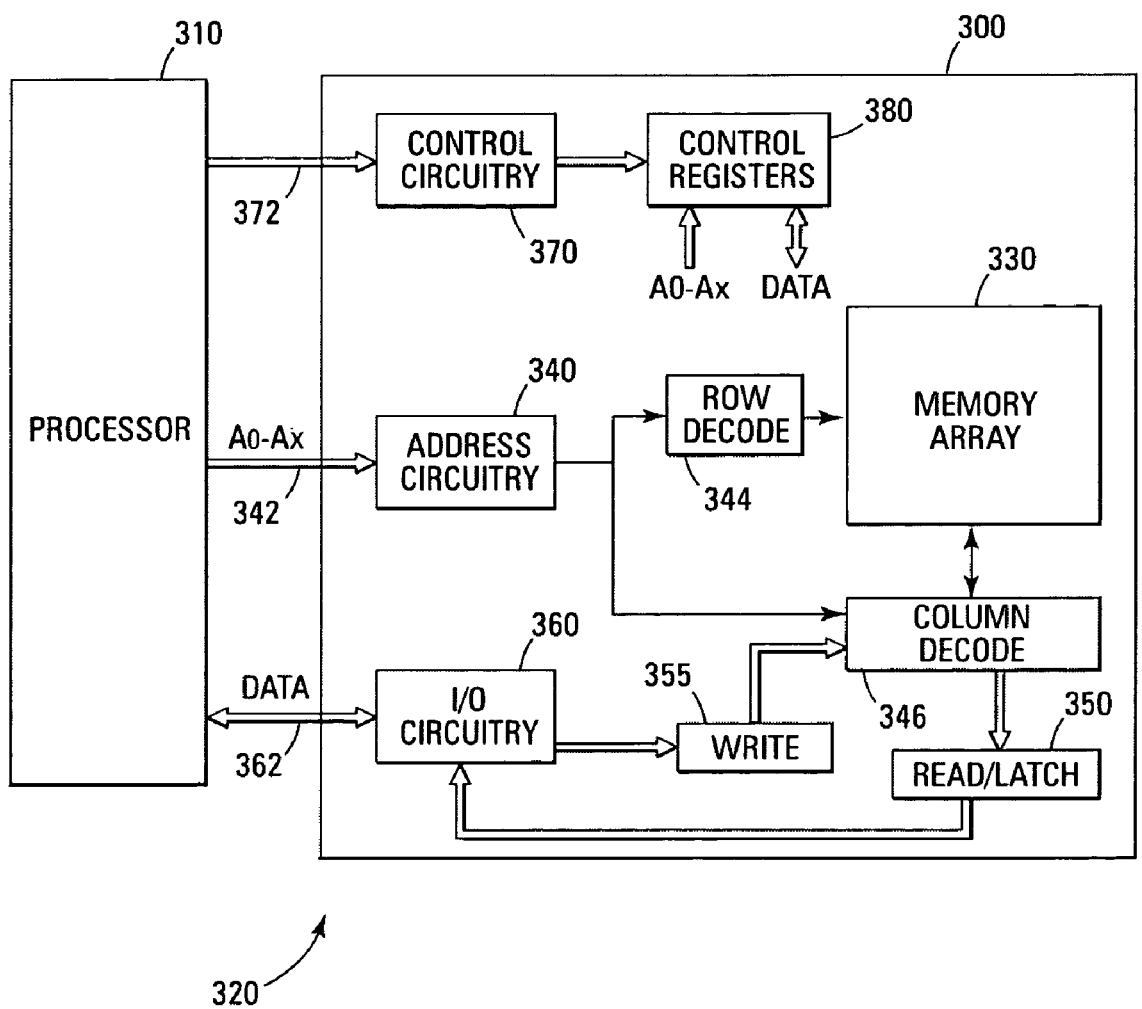
FIG. 3 shows a block diagram of one embodiment of an electronic system of the present invention.

FIG. 3 illustrates a functional block diagram of a memory device 300 of one embodiment of the present invention that is coupled to a processor 310. The processor 310 may be a microprocessor, a processor, or some other type of controlling circuitry. The memory device 300 and the processor 310 form part of an electronic system 320. The memory device 300 has been simplified to focus on features of the memory that are helpful in understanding the present invention.

The memory device includes an array of memory cells 330. In one embodiment, the memory cells are non-volatile floating-gate memory cells and the memory array 330 is arranged in banks of rows and columns.

An address buffer circuit 340 is provided to latch address signals provided on address input connections A0–Ax 342. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense/latch circuitry 350. The sense/latch circuitry, in one embodiment, is coupled to read and latch a row of data from the memory array 330. Data input and output buffer circuitry 360 is included for bi-directional data communication over a plurality of data connections 362 with the controller 310). Write circuitry 355 is provided to write data to the memory array.

Control circuitry 370 decodes signals provided on control connections 372 from the processor 310. These signals are used to control the operations on the memory array 330, including data read, data write, and erase operations. In one embodiment, the control circuitry 370 executes the erase methods of the present invention. The control circuitry 370 may be a state machine, a sequencer, or some other type of controller.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, an improved erase process no longer requires the preprogram step in order to prevent flash memory cells from being overerased. By monitoring the cell erase current to adjust it and maintain it in the range of 30–40 µA, the erase operation can be accomplished quicker and with a better erase cell current distribution than previously possible. p The embodiments of the present invention are not limited to any one type of memory technology. For example, the circuits and methods of the present invention may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a flash memory device comprising a memory array having a plurality of memory cells organized in columns and rows, the method comprising:
   generating an erase pulse to a first column without performing a prior preprogram step;
   performing a current leakage check on the first column;
   determining an overerased memory cell in the first column having current leakage that has an erase current greater than a first reference current level; and
   applying a soft program pulse to the overerased memory cell until the erase current is less than the first reference current level.

2. The method of claim 1 and further including, prior to performing the current leakage check, applying additional erase pulses to memory cells that have an erase current less than a second reference current level until the erase current is at least equivalent to the second reference current level.

3. The method of claim 2 wherein the first and second reference current levels are sense amplifier reference current levels.

4. The method of claim 1 wherein the memory array further includes a plurality of wordlines coupling the rows of memory cells and the method further including applying a positive voltage to a selected wordline of the plurality of wordlines and a negative voltage to unselected wordlines.

5. The method of claim 1 wherein the soft program pulse is applied to the overerased memory cell until the erase current is less than a second reference current level or a maximum quantity of soft program pulses have been applied.

6. The method of claim 2 wherein the additional erase pulses are applied to memory cells having the erase current less than the second reference current level until a first of the erase current is equivalent to the second reference current level or a maximum quantity of erase pulses have been applied.

7. The method of claim 1 wherein the flash memory is a NOR-type flash memory.

8. The method of claim 1 wherein the flash memory is a NAND-type flash memory.

9. A method for erasing a flash memory device comprising a memory array having a plurality of memory cells organized in columns coupled by bitlines and rows coupled by wordlines, the method comprising:
   generating an erase pulse to a predetermined set of memory columns without performing a prior preprogram step;
   performing a first erase verification on the predetermined set of memory columns to determine if each of the plurality of memory cells has an erase current less than a first reference current level;
   performing a current leakage check on each column;
   performing a second erase verification to find an overerased memory cell in a first column having current leakage; and
   applying a soft program pulse to the overerased memory cell until an erase current of the overerased memory cell is less than a second reference current level or a maximum quantity of soft program pulses are applied.

10. The method of claim 9 wherein the second erase verification begins at the first column.

11. The method of claim 9 wherein the soft program pulses are applied until the erase current is substantially equivalent to the second reference current level.

12. A method for erasing a flash memory device comprising a plurality of memory blocks each having a plurality of memory cells organized in columns coupled by bitlines and rows coupled by wordlines, the method comprising:

generating an erase pulse to a first memory block;

performing a first erase verification on the first memory block to determine if each of the plurality of memory cells has an erase current less than a first reference current level;

applying additional erase pulses to any memory cell of the first memory block having an erase current less than the first reference current level until either the erase current is substantially equal to or greater than the first reference current level or a maximum quantity of additional erase pulses is applied;

performing a current leakage check on each column;

performing a second erase verification to find in the column with current leakage an overerased memory cell having an erase current substantially equal to or greater than a second reference current level; and applying a soft program pulse to the overerased memory cell until either the erase current of the overerased memory cell is less than the second reference current level or a maximum quantity of soft program pulses are applied.

13. The method of claim 12 and further including indicating an erase error when either the maximum quantity of additional erase pulses or the maximum quantity of soft program pulses is applied.

14. The method of claim 12 and further including:

applying a positive voltage to the wordlines of the block of memory; and applying a negative voltage to unselected wordlines of the block of memory.

15. The method of claim 12 wherein voltages used in the soft program pulse are less than voltages used in a program pulse.

16. A non-volatile memory device comprising:

a memory array comprising a plurality of memory cells arranged in rows and columns such that the rows are coupled with wordlines and the columns are coupled with bitlines; and a control circuit that executes methods including generating an erase pulse to the memory array without performing a prior preprogram step, performing a current leakage check on each column, determining an overerased memory cell in a column with current leakage that has an erase current greater than a first reference current level, and applying a soft program pulse to the overerased memory cell until either the erase current is less than the first reference current level or a maximum quantity of soft program pulses are applied.

17. The memory device of claim 16 wherein the memory array is coupled in a NOR architecture.

18. The memory device of claim 16 wherein the memory array is coupled in a NAND architecture.

19. The memory device of claim 16 and the control circuit further executes methods including, prior to performing a current leakage check, performing an erase verification on the plurality of memory cells and applying additional erase pulses to any memory cells of the plurality of memory cells that have an erase current less than a second reference current level.

20. An electronic system comprising:

a processor that generates control signals; and a non-volatile memory device, coupled to the processor, that operates in response to the control signals, the device comprising:

an array of memory cells arranged in rows and columns such that the rows are coupled with wordlines and the columns are coupled with bitlines; and a control circuit that executes methods including generating an erase pulse to the array of memory cells without performing a prior preprogram step, performing a current leakage check on each column, determining an overerased memory cell in a column with current leakage that has an erase current greater than a first reference current level, and applying a soft program pulse to the overerased memory cell until either the erase current is less than a second reference current level or a maximum quantity of soft program pulses are applied.

* * * * *